ated under 35

(12) United States Patent
Hieno et al.

(10) Patent No.: US 10,249,531 B1
(45) Date of Patent: Apr. 2, 2019

(54) METHOD FOR FORMING METAL WIRING

(71) Applicant: Toshiba Memory Corporation, Minato-ku (JP)

(72) Inventors: Atsushi Hieno, Yokohama (JP); Tsutomu Nakanishi, Yokohama (JP); Yusuke Tanaka, Kawasaki (JP); Yasuhito Yoshimizu, Yokkaichi (JP); Akihiko Happoya, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/892,536

(22) Filed: Feb. 9, 2018

(30) Foreign Application Priority Data

Sep. 20, 2017 (JP) ................................. 2017-180292

(51) Int. Cl.
| | | |
|---|---|---|
| C23C 18/18 | (2006.01) | |
| H01L 21/768 | (2006.01) | |
| H01L 23/00 | (2006.01) | |
| C23C 18/31 | (2006.01) | |
| C23C 18/16 | (2006.01) | |

(52) U.S. Cl.
CPC .... *H01L 21/76874* (2013.01); *C23C 18/1605* (2013.01); *C23C 18/1882* (2013.01); *C23C 18/31* (2013.01); *H01L 24/03* (2013.01); *H01L 24/08* (2013.01); *H01L 2224/03464* (2013.01); *H01L 2224/08145* (2013.01)

(58) Field of Classification Search
CPC . H01L 21/76874; H01L 24/03; C07D 251/12; C23C 18/16; C23C 18/18; C23C 18/34; C23C 18/40; C23C 18/1882; C23C 18/1605; C23C 18/1608; C23C 18/165; C23C 18/1893; C23C 18/31; C23F 1/00; H05K 3/18
See application file for complete search history.

(56) References Cited

U.S. PATENT DOCUMENTS

| | | | |
|---|---|---|---|
| 5,753,536 A | 5/1998 | Sugiyama et al. | |
| 9,991,159 B2 * | 6/2018 | Ito | H01L 23/53209 |

(Continued)

FOREIGN PATENT DOCUMENTS

| | | |
|---|---|---|
| JP | 08-125121 | 5/1996 |
| JP | 2797650 | 7/1998 |

(Continued)

*Primary Examiner* — Thanh T Nguyen
(74) *Attorney, Agent, or Firm* — Oblon, McClelland, Maier & Neustadt, L.L.P.

(57) ABSTRACT

A method for forming a metal wiring according to embodiments includes forming a first insulating layer on a substrate; forming a catalyst adsorption layer by bringing a surface of the first insulating layer into contact with a solution containing a compound having a triazine skeleton, a first functional group of one of a silanol group and an alkoxysilyl group, and a second functional group of at least one selected from the group consisting of an amino group, a thiol group, a carboxyl group, and an azide group; forming a second insulating layer different from the first insulating layer on the catalyst adsorption layer; patterning the second insulating layer to form a mask pattern; etching the first insulating layer by a wet etching method; selectively forming a catalyst layer; and forming a metal layer on the catalyst layer by an electroless plating method.

14 Claims, 8 Drawing Sheets

(56) References Cited

U.S. PATENT DOCUMENTS

| | | | |
|---|---|---|---|
| 2012/0073651 A1* | 3/2012 | Fujimoto | H01L 31/02168 136/258 |
| 2012/0228654 A1* | 9/2012 | Fujimoto | H01L 33/38 257/98 |
| 2013/0078570 A1 | 3/2013 | Hien et al. | |
| 2015/0261092 A1 | 9/2015 | Hieno et al. | |
| 2016/0035948 A1 | 2/2016 | Happoya et al. | |
| 2017/0294408 A1* | 10/2017 | Happoya | H01L 25/0655 |

FOREIGN PATENT DOCUMENTS

| | | |
|---|---|---|
| JP | 2003-149831 | 5/2003 |
| JP | 2013-026329 | 2/2013 |
| TW | 200948476 A1 | 12/2009 |
| TW | 201434080 A | 9/2014 |

* cited by examiner

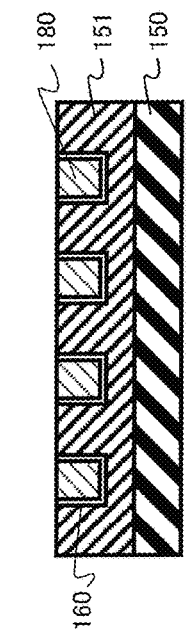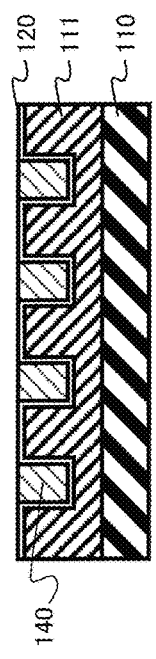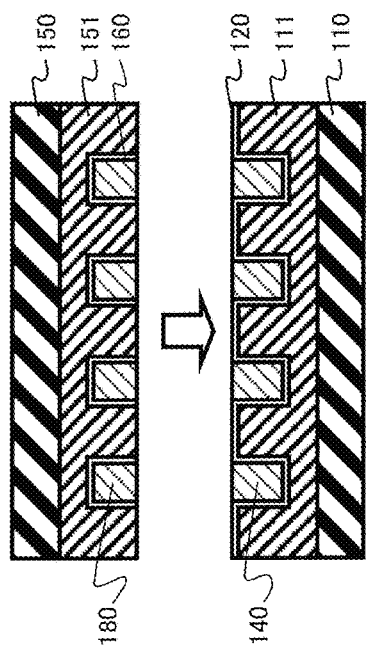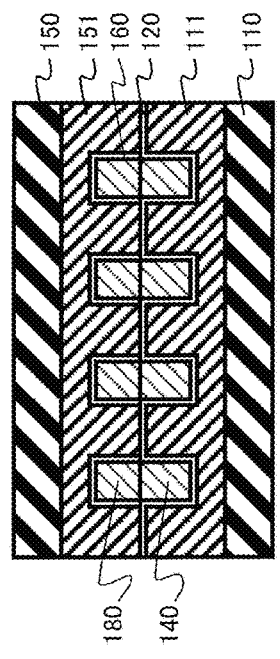
FIG.6A  FIG.6B  FIG.6C

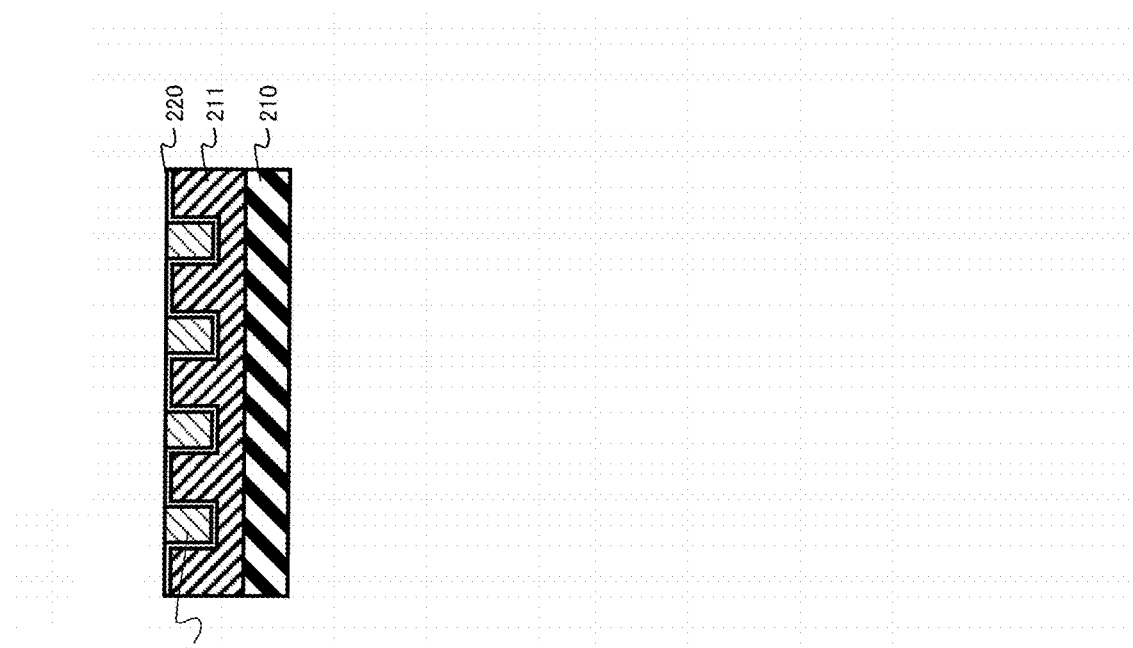
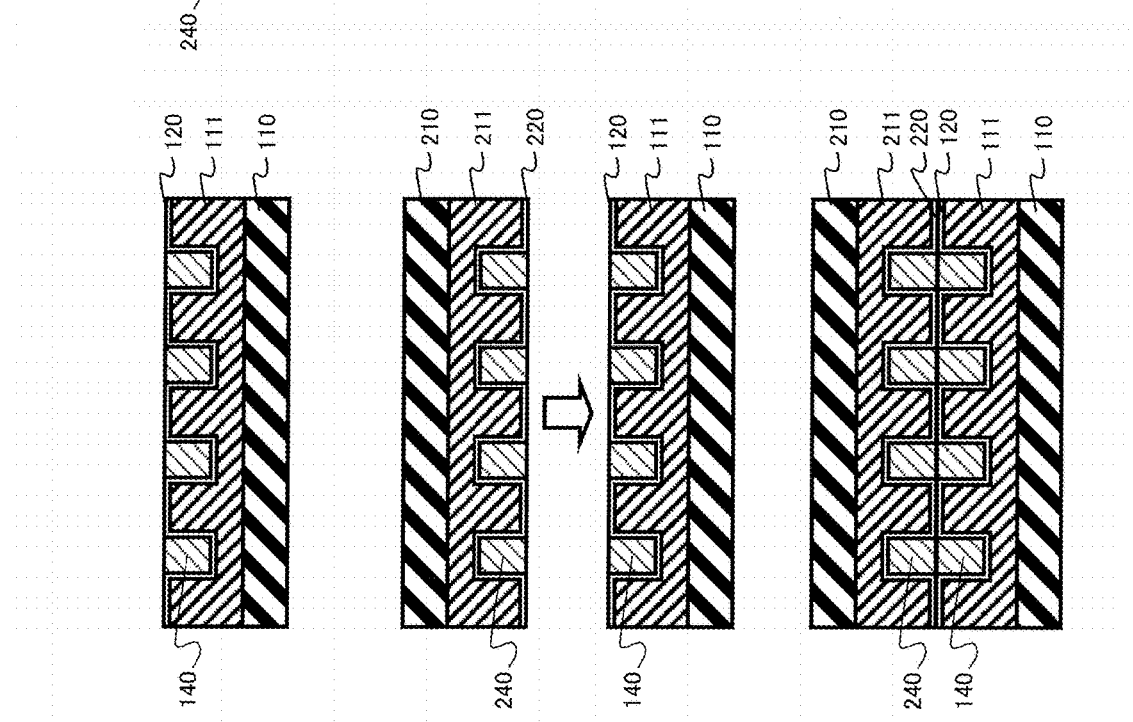
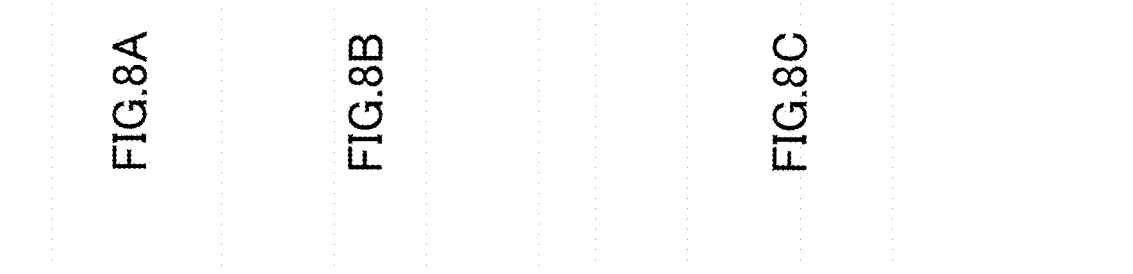
FIG.8A
FIG.8B
FIG.8C

METHOD FOR FORMING METAL WIRING

CROSS-REFERENCE TO RELATED APPLICATION

This application is based upon and claims the benefit of priority from Japanese Patent Application No. 2017-180292, filed on Sep. 20, 2017, the entire contents of which are incorporated herein by reference.

FIELD

Embodiments described herein relate generally to a method for forming a metal wiring.

BACKGROUND

A metal wiring is used in semiconductor devices, for example, to obtain electrical connection between elements such as transistors and diodes. In addition, to achieve multifunctionality and high integration of semiconductor devices, substrate bonding may be used. In substrate bonding, semiconductor devices formed on different substrates are stacked and bonded together to be integrated. For example, multifunctionalization of semiconductor devices can be realized by bonding semiconductor devices having different functions. Further, for example, by bonding semiconductor devices having the same type of functions, the semiconductor devices can be highly integrated. In substrate bonding, for example, the metal wirings formed on a surface of each substrate are directly bonded to each other to obtain electrical connection between the stacked semiconductor devices.

Forming a metal wiring at low cost is desired to reduce the cost of a semiconductor device. Further, a method for forming a metal wiring which can realize substrate bonding at low cost is desired.

BRIEF DESCRIPTION OF THE DRAWINGS

FIGS. 6A, 6B, and 6C are explanatory views of a substrate bonding method according to the second embodiment;

FIGS. 8A, 8B, and 8C are explanatory views of a substrate bonding method according to the third embodiment.

DETAILED DESCRIPTION

Figure 1A:
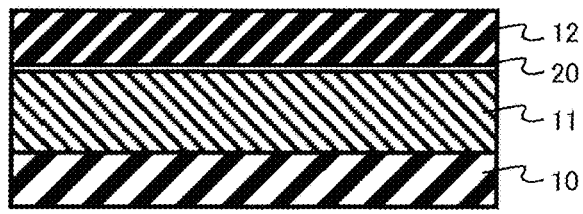
FIGS. 1A, 1B, 1C, 1D, 1E, and 1F are explanatory views of a method for forming a metal wiring according to a first embodiment.

A method for forming a metal wiring according to an embodiment described herein includes: forming a first insulating layer on a substrate; forming a catalyst adsorption layer by bringing a surface of the first insulating layer into contact with a solution containing a compound having a triazine skeleton, a first functional group of one of a silanol group and an alkoxysilyl group, and a second functional group of at least one selected from the group consisting of an amino group, a thiol group, a carboxyl group, and an azide group; forming a second insulating layer different from the first insulating layer on the catalyst adsorption layer; patterning the second insulating layer to form a mask pattern; etching the first insulating layer by a wet etching method using the mask pattern as a mask; selectively forming a catalyst layer in a region where the first insulating layer is etched; and forming a metal layer on the catalyst layer by an electroless plating method.

Embodiments of the present disclosure will be described below with reference to drawings. In description below, same or similar members will be denoted by same reference characters, and description of members already described will be appropriately omitted.

First Embodiment

A method for forming a metal wiring according to a first embodiment includes: forming a first insulating layer on a substrate; forming a catalyst adsorption layer by bringing a surface of the first insulating layer into contact with a solution containing a compound having a triazine skeleton, a first functional group of one of a silanol group and an alkoxysilyl group, and a second functional group of at least one selected from the group consisting of an amino group, a thiol group, a carboxyl group, and an azide group; forming a second insulating layer different from the first insulating layer on the catalyst adsorption layer; patterning the second insulating layer to form a mask pattern; removing the first insulating layer by a wet etching method using the mask pattern as a mask; selectively forming a catalyst layer in a region where the first insulating layer is removed; and forming a metal layer on the catalyst layer by an electroless plating method.

FIGS. 1A, 1B, 1C, 1D, 1E, and 1F are explanatory views of a method for forming a metal wiring according to the first embodiment. FIGS. 1A, 1B, 1C, 1D, 1E, and 1F are cross-sectional views of a process of forming a metal wiring.

First, a substrate 10 is prepared. The substrate 10 is, for example, a single crystal silicon substrate.

Next, a first insulating layer 11 is formed on the substrate 10. The first insulating layer 11 is, for example, an oxide, a nitride, or an oxynitride. The oxide is, for example, silicon oxide or aluminum oxide. The nitride is, for example, silicon nitride or aluminum nitride. The oxynitride is, for example, silicon oxynitride or aluminum oxynitride. The first insulating layer 11 is, for example, silicon oxide.

Next, a catalyst adsorption layer 20 is formed on the first insulating layer 11. The thickness of the catalyst adsorption layer 20 is, for example, 2 nm or less.

The catalyst adsorption layer 20 is formed by bringing a surface of the first insulating layer 11 into contact with a solution containing a triazine compound having a triazine skeleton, a first functional group of one of a silanol group and an alkoxysilyl group, and a second functional group of at least one selected from the group consisting of an amino group, a thiol group, a carboxyl group, and an azide group. The triazine compound has the triazine skeleton, the first functional group, and the second functional group.

The triazine compound according to the first embodiment is represented by the following formula (1).

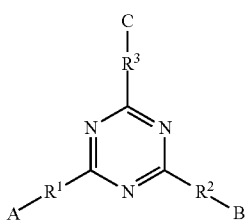

(1)

In the formula (1), A, B, and C is functional groups. At least one of A, B, and C is any one of a silanol group and an alkoxysilyl group, at least one is selected from the group consisting of an amino group, a thiol group, a carboxyl group, and an azide group, and $R^1$, $R^2$, and $R^3$ are optionally present connecting groups.

The alkoxysilyl group is, for example, a trimethoxysilyl group, a dimethoxymethylsilyl group, a monomethoxydimethylsilyl group, a triethoxysilyl group, a diethoxymethylsilyl group, or a monoethoxydimethylsilyl group. For example, $R^1$, $R^2$, and $R^3$ include a secondary amine or an alkyl chain. For example, a case where $R^1$, $R^2$, and $R^3$ do not exist, and an amino group, a thiol group, a carboxyl group or an azide group is bonded directly to a triazine ring may be acceptable.

For example, one of A, B, and C may be either a silanol group or an alkoxysilyl group, and the remaining two may be at least one selected from the group consisting of an amino group, a thiol group, a carboxyl group, and an azide group.

The solvent of the solution containing the triazine compound is, for example, water. The solvent of the solution containing the triazine compound is, for example, an alcohol solvent such as methanol, ethanol, propanol, ethylene glycol, glycerin, or propylene glycol monoethyl ether.

A surface of the first insulating layer 11 is in contact with the solution containing the triazine compound, for example, by immersing the substrate 10 in the solution containing the triazine compound. Alternatively, those are in contact with each other by coating the solution containing the triazine compound on the first insulating layer 11.

The surface of the first insulating layer 11 is in contact with the solution containing the triazine compound, for example, for 1 minute or less.

Next, a second insulating layer 12 different from the first insulating layer 11 is formed on the catalyst adsorption layer 20 (FIG. 1A). The second insulating layer 12 is, for example, a resin layer. The second insulating layer 12 is, for example, a photoresist.

Figure 1B:
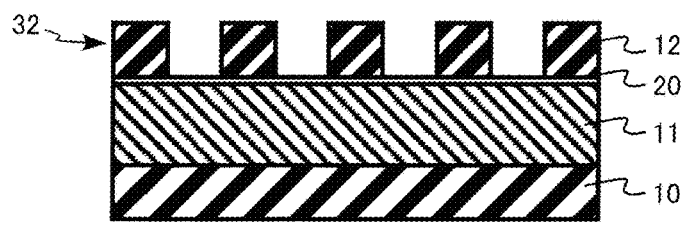

Next, the second insulating layer 12 is patterned to form a mask pattern 32 (FIG. 1B). For example, when the second insulating layer 12 is a photoresist, the mask pattern 32 is formed by a known lithography method.

The mask pattern 32 is, for example, a line-and-space pattern. The catalyst adsorption layer 20 remains on the first insulating layer 11 in a region where the second insulating layer 12 is not present.

Figure 1C:
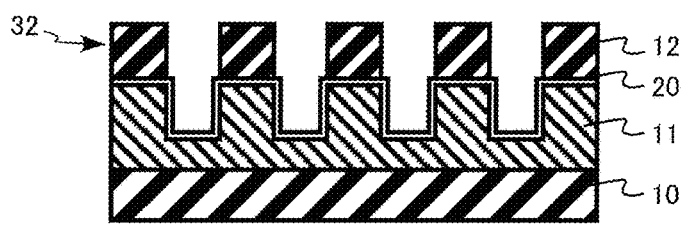

Next, using the mask pattern 32 as a mask, the first insulating layer 11 is etched (FIG. 1C). By etching the first insulating layer 11, a groove is formed on the first insulating layer 11. The etching of the first insulating layer 11 is performed by a wet etching method.

A chemical solution used in the wet etching method includes hydrogen fluoride, ammonium fluoride, or phosphoric acid. The chemical solution used in the wet etching method is, for example, hydrofluoric acid, an ammonium fluoride solution, or a phosphoric acid solution.

When the first insulating layer 11 is silicon oxide, hydrofluoric acid or an ammonium fluoride solution is used as the chemical solution.

As illustrated in FIG. 1C, after the first insulating layer 11 is etched, the catalyst adsorption layer 20 selectively remains on the first insulating layer 11.

Figure 1D:
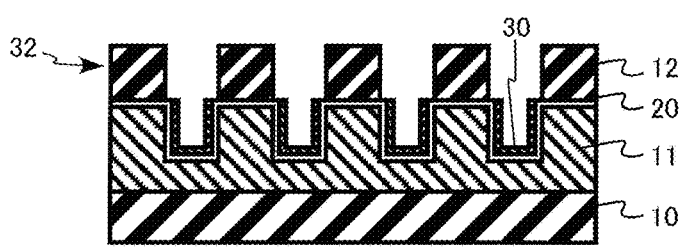

Next, a catalyst layer 30 is selectively formed in the region where the first insulating layer 11 has been etched (FIG. 1D). The catalyst layer 30 is formed by having a plating catalyst be absorbed on the catalyst adsorption layer 20 remaining on the first insulating layer 11.

The plating catalyst is not particularly limited as long as it is a catalyst for electroless plating. For example, palladium (Pd), silver (Ag), copper (Cu), gold (Au), and platinum (Pt) can be used.

The catalyst layer 30 is formed by bringing a solution containing the plating catalyst into contact with a surface of the catalyst adsorption layer 20. The surface of the catalyst adsorption layer 20 is in contact with the solution containing the plating catalyst, for example, for 1 minute or less.

Figure 1E:
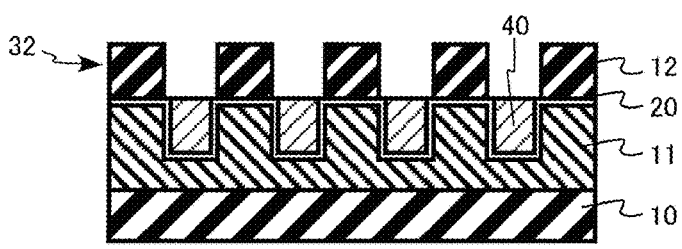

Next, a metal layer 40 is formed on the catalyst layer 30 by an electroless plating method (FIG. 1E). The metal layer 40 is selectively formed on the catalyst layer 30. The groove formed in the first insulating layer 11 is buried with the metal layer 40. In FIG. 1E, illustration of the catalyst layer 30 is omitted.

A material of the metal layer 40 is, for example, nickel (Ni), copper (Cu), cobalt (Co), gold (Au), zinc (Zn), tin (Sn), chromium (Cr), ruthenium (Ru), or silver (Ag).

The metal layer 40 is formed by immersing the substrate 10 in a plating solution. The plating solution contains, for example, a metal ion for forming the metal layer 40, a reducing agent, and a stabilizer for stabilizing the metal ion. The substrate 10 is immersed into the plating solution, for example, for 2 minutes or less.

Figure 1F:
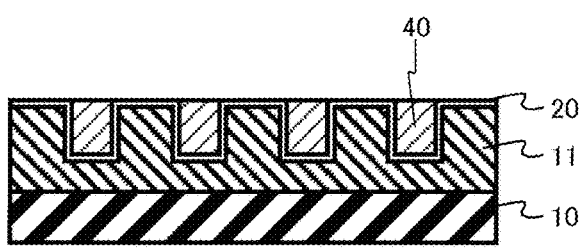

Next, the mask pattern 32 is removed (FIG. 1F). When the mask pattern 32 is a photoresist, the mask pattern 32 is removed, for example, using an alkaline solution. After the mask pattern 32 is removed, the catalyst adsorption layer 20 remains on the first insulating layer 11.

According to the above-described manufacturing method, the metal layer 40 is provided in the groove provided in the first insulating layer 11. The metal layer 40 is used as a metal wiring. The metal layer 40 has a so-called damascene structure.

The method for forming a metal wiring according to the first embodiment can be used, for example, for forming a metal wiring for a semiconductor device having an element such as a transistor.

Functions and effects according to the first embodiment will be described below.

Forming a metal wiring at low cost is desired to reduce the cost of a semiconductor device.

FIGS. 2A, 2B, 2C, 2D, 2E, 2F, and 2G are explanatory views of a method for forming a metal wiring according to a comparative example. FIGS. 2A, 2B, 2C, 2D, 2E, 2F, and 2G are cross-sectional views of a process of forming a metal wiring.

First, a substrate 50 is prepared. The substrate 50 is, for example, a single crystal silicon substrate.

Next, a first insulating layer 51 is formed on the substrate 50. The first insulating layer 51 is, for example, an oxide, a nitride, or an oxynitride.

Next, a second insulating layer 52 different from the first insulating layer 51 is formed on the first insulating layer 51

Figure 2A:
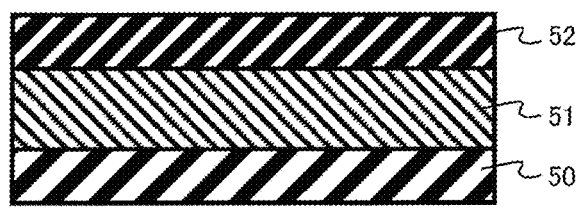
FIGS. 2A, 2B, 2C, 2D, 2E, 2F, and 2G are explanatory views of a method for forming a metal wiring according to a comparative example.

(FIG. 2A). The second insulating layer 52 is, for example, a resin layer. The second insulating layer 52 is, for example, a photoresist.

Figure 2B:
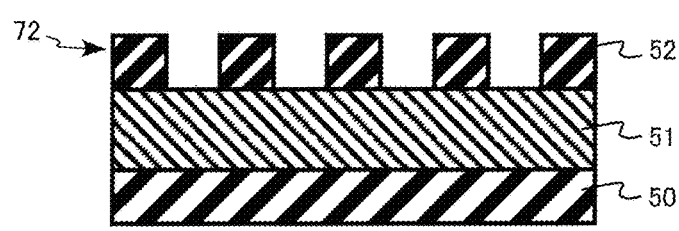

Next, the second insulating layer 52 is patterned to form a mask pattern 72 (FIG. 2B). For example, when the second insulating layer 52 is a photoresist, a mask pattern 72 is formed by a known lithography method.

Figure 2C:

Next, using the mask pattern 72 as a mask, the first insulating layer 51 is etched (FIG. 2C). By etching the first insulating layer 51, a groove is formed in the first insulating layer 51.

Figure 2D:
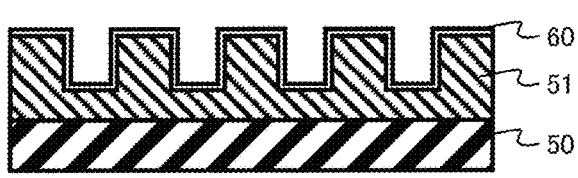

Next, the mask pattern 72 is removed, and a catalyst adsorption layer 60 is formed on the first insulating layer 51 (FIG. 2D).

Figure 2E:
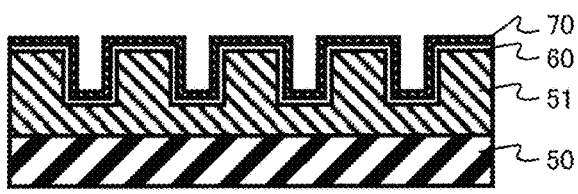

Next, a catalyst layer 70 is formed on the catalyst adsorption layer 60 (FIG. 2E).

Figure 2F:
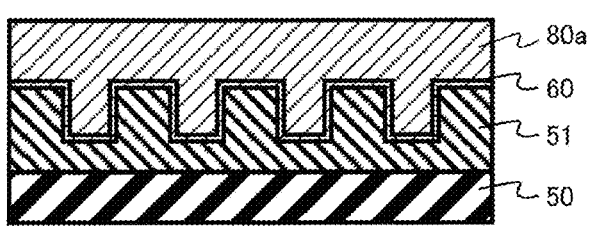

Next, a metal film 80a is formed on the catalyst layer 70 by an electroless plating method (FIG. 2F).

Figure 2G:
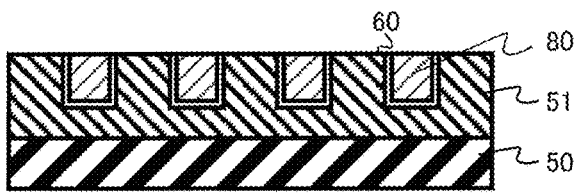

Next, the metal film 80a in the region other than the groove formed in the first insulating layer 51 is removed (FIG. 2G). By removing the metal film 80a, a metal layer 80 is formed. The metal film 80a is removed by, for example, chemical mechanical polishing (CMP). The catalyst adsorption layer 60 on the first insulating layer 51 is also removed simultaneously with the metal film 80a by CMP. Further, for example, the metal film 80a is removed by wet etching. A chemical solution used for wet etching is, for example, hydrochloric acid/hydrogen peroxide solution, nitric acid/hydrogen peroxide solution, or sulfuric acid/hydrogen peroxide solution.

In the above-described method for forming a metal wiring according to the comparative example, the metal film 80a cannot be selectively formed in the groove formed in the first insulating layer 51 when the metal film 80a is formed. Therefore, a step for removing the metal film 80a, such as CMP or wet etching, is required.

On the other hand, according to the method for forming a metal wiring according to the first embodiment, the metal layer 40 can be selectively formed in the groove formed in the first insulating layer 11. Therefore, a step such as CMP and wet etching is not needed. As a result, a metal wiring can be formed at low cost.

Figure 3A:
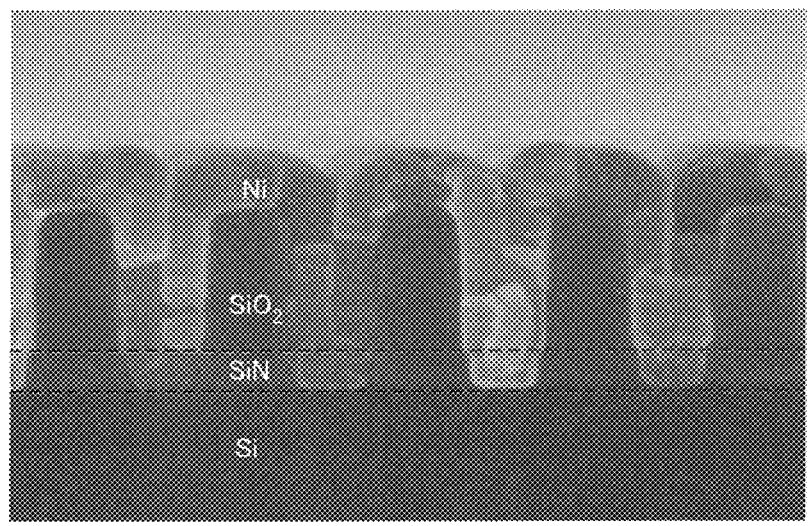
FIGS. 3A and 3B are explanatory views of functions and effects according to the first embodiment.
Figure 3B:
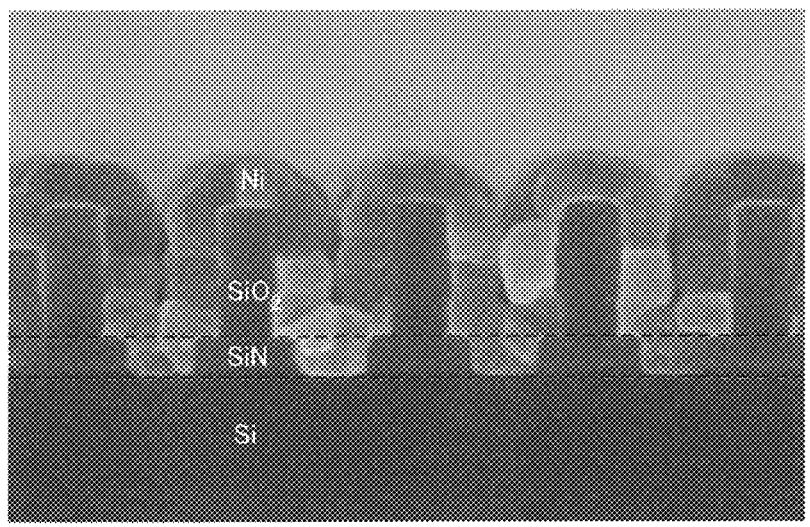

Hereinafter, the step for etching the first insulating layer 11 by a wet etching method according to the first embodiment will be described in detail. FIGS. 3A and 3B are explanatory views of functions and effects according to the first embodiment.

As described above, after the first insulating layer 11 is etched, the catalyst adsorption layer 20 selectively remains on the first insulating layer 11.

A silicon nitride film (SiN) and a silicon oxide film ($SiO_2$) are deposited on a silicon substrate (Si), and a first sample is prepared, on which the silicon nitride film (SiN) and the silicon oxide film ($SiO_2$) are patterned to form a line-and-space pattern.

The first sample is immersed into a triazine compound aqueous solution to form a catalyst adsorption layer. The triazine compound aqueous solution contains the triazine compound represented by the above formula (1). Next, the first sample is immersed into a palladium solution to form a catalyst layer. Subsequently, a NiB plating solution is used to form a nickel layer (Ni).

A second sample was prepared in the same manner as the first sample except that wet etching was performed before forming the catalyst layer after forming the catalyst adsorption layer. Hydrofluoric acid is used as the chemical solution for wet etching.

FIGS. 3A and 3B are cross-sectional photographs of a first sample and a second sample taken by a scanning electron microscope (SEM) after a nickel layer is formed. FIG. 3A indicates a first sample, and FIG. 3B indicates a second sample.

In FIG. 3A, a nickel layer is conformally formed in a space of and on a line of the line-and-space pattern.

In the case of FIG. 3B, before and after the catalyst adsorption layer is formed, a line formed of a silicon oxide film is etched and thinned by immersing in a solution of hydrofluoric acid. Thus, it can be seen that the catalyst adsorption layer does not serve as a mask for wet etching, and the etching of the silicon oxide film is progressed.

Furthermore, a nickel layer is conformally formed in a space of and on a line of the line-and-space pattern of the second sample as with the first sample. Thus, it can be seen that the catalyst adsorption layer remains on the surface even after wet etching.

As described above, it is not necessarily clear why the catalyst adsorption layer does not serve as an etching mask during wet etching and why the catalyst adsorption layer remains on the surface even after an underlying insulating layer is etched by wet etching. For example, it may be because the catalyst adsorption layer is reattached that the catalyst adsorption layer remains on the surface even after the underlying insulating layer is etched since. However, it has not been confirmed.

In the method for forming a metal wiring according to the first embodiment, it is possible to selectively form the metal layer 40 in the groove formed in the first insulating layer 11 by utilizing the above-described peculiar phenomenon.

The thickness of the catalyst adsorption layer 20 is preferably 2 nm or less. If the thickness exceeds the above range, there is a possibility that the catalyst adsorption layer 20 serves as a mask, and the first insulating layer 11 is not etched.

In the first embodiment, the case where the mask pattern 32 is removed after the metal layer 40 is formed has been described as an example. However, it is also possible, for example, to use the mask pattern 32 as an interlayer insulating layer without removing the mask pattern 32.

As described above, according to the method for forming a metal wiring of the first embodiment, a metal wiring can be selectively formed in the groove formed in the insulating layer. Therefore, a metal wiring can be formed at low cost.

Second Embodiment

A method for forming a metal wiring according to a second embodiment includes: forming a first insulating layer on a first substrate; forming a catalyst adsorption layer by bringing a surface of the first insulating layer into contact with a solution containing a compound having a triazine skeleton, a first functional group of one of a silanol group and an alkoxysilyl group, and a second functional group of at least one selected from the group consisting of an amino group, a thiol group, a carboxyl group, and an azide group; forming a second insulating layer different from the first insulating layer on the catalyst adsorption layer; patterning the second insulating layer to form a mask pattern; etching the first insulating layer by a wet etching method using the mask pattern as a mask; selectively forming a catalyst layer in a region where the first insulating layer is etched; forming a first metal layer on the catalyst layer by an electroless plating method; removing the mask pattern after the metal layer is formed; and bonding the first substrate and a second substrate on which the second metal layer is formed such that the first metal layer and the second metal layer are in contact with each other.

The method for forming a metal wiring according to the second embodiment is different from that of the first embodiment in that the second substrate is bonded on the first substrate. Hereinafter, description of details already described in the first embodiment will be omitted.

First, metal wirings are formed on a first substrate 110 and a second substrate 150.

FIGS. 4A, 4B, 4C, 4D, 4E, and 4F are explanatory views of a method for forming a metal wiring of the first substrate according to the second embodiment. FIGS. 4A, 4B, 4C, 4D, 4E, and 4F are cross-sectional views of a process of forming a metal wiring on the first substrate. The method for forming a metal wiring of the first substrate is the same as the method for forming a metal wiring according to the first embodiment.

Figure 4A:
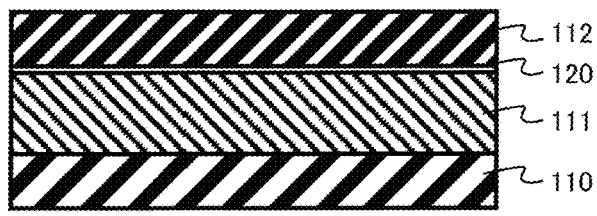
FIGS. 4A, 4B, 4C, 4D, 4E, and 4F are explanatory views of a method for forming a metal wiring of a first substrate according to a second embodiment.

First, the first substrate 110 is prepared. Next, a first insulating layer 111 is formed on the first substrate 110. Next, a first catalyst adsorption layer 120 is formed on the first insulating layer 111. Next, a second insulating layer 112 different from the first insulating layer 111 is formed on the first catalyst adsorption layer 120 (FIG. 4A).

Figure 4B:
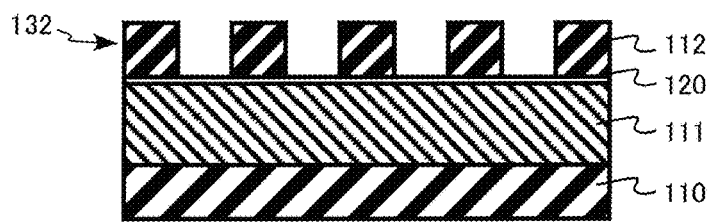
Figure 4C:
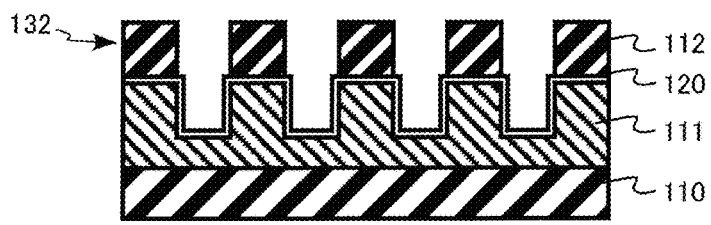

Next, the second insulating layer 112 is patterned to form a first mask pattern 132 (FIG. 4B). Next, using the first mask pattern 132 as a mask, the first insulating layer 111 is etched by a wet etching method (FIG. 4C).

Figure 4D:
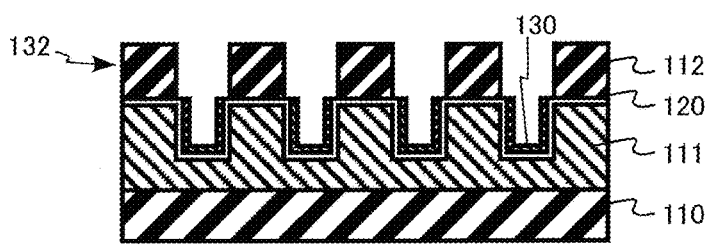
Figure 4E:
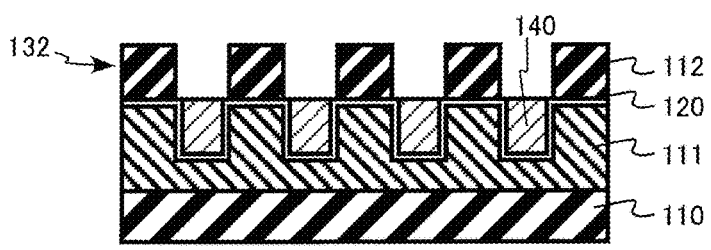
Figure 4F:
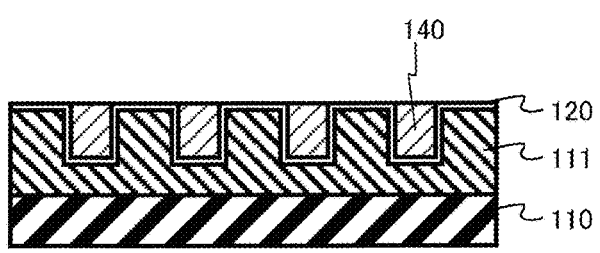

Next, a first catalyst layer 130 is selectively formed in a region where the first insulating layer 111 is etched (FIG. 4D). Next, a first metal layer 140 is formed on the first catalyst layer 130 by an electroless plating method (FIG. 4E). According to the above-described manufacturing method, the first metal layer 140 to be a first metal wiring is formed on the first substrate 110.

FIGS. 5A, 5B, 5C, 5D, 5E, 5F, and 5G are explanatory views of a method for forming a metal wiring of the second substrate according to the second embodiment. FIGS. 5A, 5B, 5C, 5D, 5E, 5F, and 5G are cross-sectional views of a process of forming a metal wiring on the second substrate. The method for forming a metal wiring of the second substrate is the same as the method for forming the metal wiring according to the comparative example of the first embodiment.

Figure 5A:
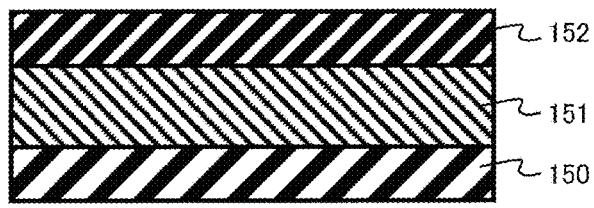
FIGS. 5A, 5B, 5C, 5D, 5E, 5F, and 5G are explanatory views of a method for forming a metal wiring of a second substrate according to the second embodiment.

First, a second substrate 150 is prepared. Next, a first insulating layer 151 is formed on the second substrate 150. Next, a second insulating layer 152 different from the first insulating layer 151 is formed on the first insulating layer 151 (FIG. 5A).

Figure 5B:
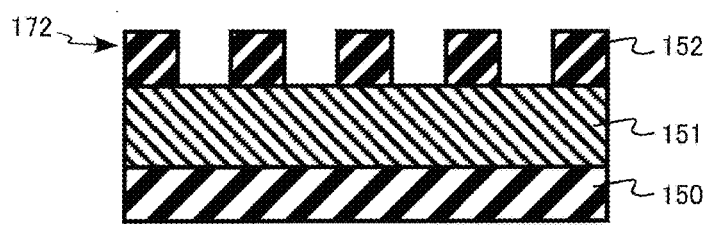
Figure 5C:
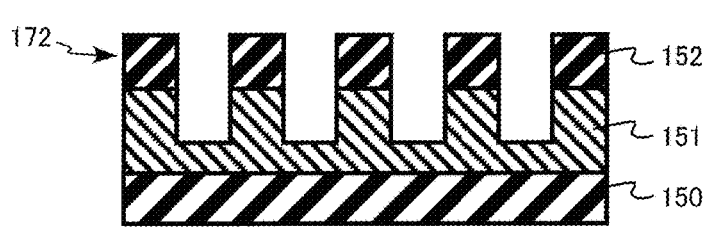

Next, the second insulating layer 152 is patterned to form a second mask pattern 172 (FIG. 5B). Next, using the second mask pattern 172 as a mask, the first insulating layer 151 is etched (FIG. 5C).

Figure 5D:
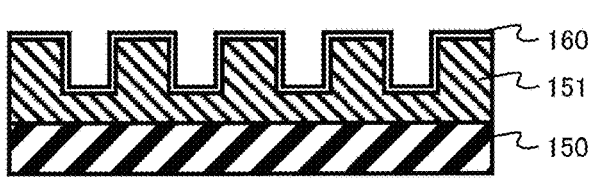
Figure 5E:
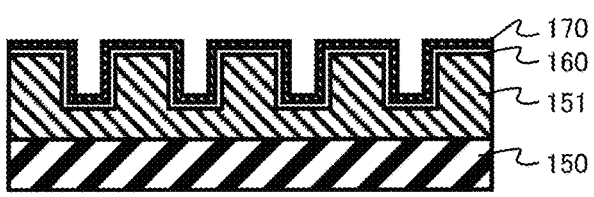

Next, the second mask pattern 172 is removed to form a second catalyst adsorption layer 160 on the first insulating layer 151 (FIG. 5D). Next, a second catalyst layer 170 is formed on the second catalyst adsorption layer 160 (FIG. 5E).

Figure 5F:
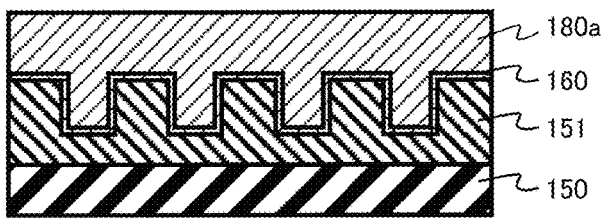
Figure 5G:
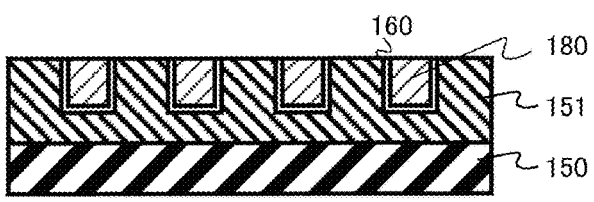

Next, a metal film 180a is formed on the second catalyst layer 170 by an electroless plating method (FIG. 5F). Next, the metal film 180a in the region other than a groove formed in the first insulating layer 151 is removed (FIG. 5G). According to the above manufacturing method, the second metal layer 180 to be a second metal wiring is formed on the second substrate 150.

FIGS. 6A, 6B, and 6C are explanatory views of a substrate bonding method according to the second embodiment.

FIGS. 6A, 6B, and 6C are cross-sectional views of a process of bonding two substrates together.

First, a first substrate 110 and a second substrate 150 on which metal wirings are separately formed are prepared (FIG. 6A).

On the first substrate 110, the first metal layer 140 is formed using the same method as the method for forming the metal wiring of the first embodiment. On the first substrate 110, the first insulating layer 111, the first catalyst adsorption layer 120 and the first metal layer 140 are formed. The first substrate 110, the first insulating layer 111, the first catalyst adsorption layer 120, and the first metal layer 140 have the same configuration as those of the substrate 10, the first insulating layer 11, the catalyst adsorption layer 20, and the metal layer 40 of the first embodiment.

On the second substrate 150, the second metal layer 180 is formed by using the same method as the method for forming a metal wiring of the comparative example. On the second substrate 150, the first insulating layer 151, the second catalyst adsorption layer 160 and the second metal layer 180 are formed. The second substrate 150, the first insulating layer 151, the second catalyst adsorption layer 160, and the second metal layer 180 have the same configuration as those of the substrate 50, the first insulating layer 51, the catalyst adsorption layer 60, and the metal layer 80 according to the comparative example.

Next, the second substrate 150 is turned upside down (FIG. 6B).

Next, the first substrate 110 and the second substrate 150 are bonded (FIG. 6C). The first substrate 110 and the second substrate 150 are bonded such that the first metal layer 140 and the second metal layer 180 are in contact with each other. For example, pressure is applied such that the first substrate 110 and the second substrate 150 are in close contact with each other. The first catalyst adsorption layer 120 functions as an adhesive layer, and the first substrate 110 and the second substrate 150 are bonded to each other.

Hereinafter, functions and effects of the method for forming a metal wiring according to the second embodiment will be described.

To achieve multifunctionality and high integration of semiconductor devices, substrate bonding may be used in some cases. In substrate bonding, semiconductor devices formed on different substrates are stacked and bonded together to be integrated. For example, multifunctionalization of semiconductor devices can be realized by bonding semiconductor devices having different functions. Further, for example, by bonding semiconductor devices having the same type of functions, the semiconductor devices can be highly integrated. In substrate bonding, for example, the metal wirings formed on a surface of each substrate are directly bonded to each other to obtain electrical connection between the stacked semiconductor devices.

To reduce the cost of semiconductor devices using substrate bonding, a method for forming a metal wiring which can realize substrate bonding at low cost is desired.

For example, a case of bonding two second substrates 150 formed by the method for forming a metal wiring according to the comparative example is considered. In this case, an additional step of plasma treatment of the surface of the second substrate 150 or formation of an adhesive layer is required prior to bonding.

For example, in the case of forming an adhesive layer, it is required for the layer to avoid the region of the second metal layer 180 on the surface. This is because if an adhesive layer is interposed between the second metal layers 180 after bonding, a contact resistance between the upper and lower second metal layers 180 becomes large and, thus, electrical connection between the stacked semiconductor devices cannot possibly be established.

In the second embodiment, the first catalyst adsorption layer 120 is formed on the first insulating layer 111 on the surface of the first substrate 110. When the first substrate 110 and the second substrate 150 are bonded to each other, between the first insulating layer 111 of the first substrate 110 and the first insulating layer 151 of the second substrate, the first catalyst adsorption layer 120 is present, and this first catalyst adsorption layer 120 functions as an adhesive layer. Therefore, when the first substrate 110 and the second substrate 150 are bonded to each other, an additional step is not needed. Consequently, according to the method for forming a metal wiring of the second embodiment, the substrate bonding at a low cost can be realized.

Further, in the first substrate 110, the first catalyst adsorption layer 120 is not formed in the region of the first metal layer 140 on the surface. In other words, the first catalyst adsorption layer 120 is formed on the first insulating layer 111 in a self-aligned manner. Therefore, a contact resistance between the first metal layer 140 and the second metal layer 180 does not increase.

As described above, according to the method for forming a metal wiring of the second embodiment, the metal wiring can be formed at low cost, as in the first embodiment. In addition, substrate bonding can be realized at low cost.

Third Embodiment

A method for forming a metal wiring according to a third embodiment includes: forming a first insulating layer on a first substrate; forming a first catalyst adsorption layer by bringing a surface of the first insulating layer into contact with a solution containing a first compound having a triazine skeleton, a first functional group of one of a silanol group and an alkoxysilyl group, and a second functional group of at least one selected from the group consisting of an amino group, a thiol group, a carboxyl group, and an azide group; forming a second insulating layer different from the first insulating layer on the first catalyst adsorption layer; patterning the second insulating layer to form a first mask pattern; etching the first insulating layer by a wet etching method using the first mask pattern as a mask; selectively forming a first catalyst layer in a region where the first insulating layer is etched; forming a first metal layer on the first catalyst layer by an electroless plating method; removing the first mask pattern after the first metal layer is formed; forming a third insulating layer on a second substrate; forming a second catalyst adsorption layer by bringing a surface of the third insulating layer into contact with a solution containing a second compound having a triazine skeleton, a first functional group of one of a silanol group and an alkoxysilyl group, and a second functional group of at least one selected from the group consisting of an amino group, a thiol group, a carboxyl group, and an azide group; forming a fourth insulating layer different from the third insulating layer on the second catalyst adsorption layer; patterning the fourth insulating layer to form a second mask pattern; etching the fourth insulating layer by a wet etching method using the second mask pattern as a mask, selectively forming a second catalyst layer in a region where the fourth insulating layer is etched; forming a second metal layer on the second catalyst layer by an electroless plating method; removing the second mask pattern after the second metal layer is formed; and bonding the first substrate and the second substrate such that the first metal layer and the second metal layer are in contact with each other.

The method for forming a metal wiring according to the third embodiment is the same as the method for forming a metal wiring according to the second embodiment, except that the metal wiring of the second substrate is formed by the same method as the method of forming a metal wiring according to the first embodiment. Hereinafter, description of details already described in the first embodiment and the second embodiment will be omitted.

First, metal wirings are formed on a first substrate 110 and a second substrate 210. The method for manufacturing the metal wiring of the first substrate is the same as that of the second embodiment, and therefore it is omitted.

FIGS. 7A, 7B, 7C, 7D, 7E, and 7F are explanatory views of a method for forming a metal wiring of a second substrate according to the third embodiment. FIGS. 7A, 7B, 7C, 7D, 7E, and 7F are cross-sectional views of a process of forming the metal wiring on the second substrate. The method for forming the metal wiring of the second substrate is the same as the method of forming a metal wiring according to the first embodiment.

Figure 7A:
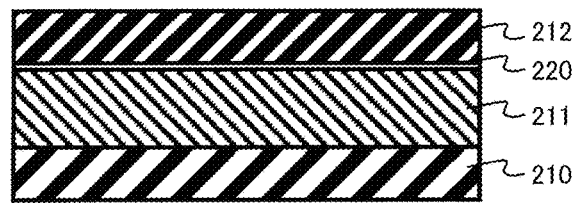
FIGS. 7A, 7B, 7C, 7D, 7E, and 7F are explanatory views of a method for forming a metal wiring of a second substrate according to a third embodiment.

First, the second substrate 210 is prepared. Next, a third insulating layer 211 is formed on the second substrate 210. Next, a catalyst adsorption layer 220 is formed on the third insulating layer 211. Next, a fourth insulating layer 212 different from the third insulating layer 211 is formed on the catalyst adsorption layer 220 (FIG. 7A).

Figure 7B:
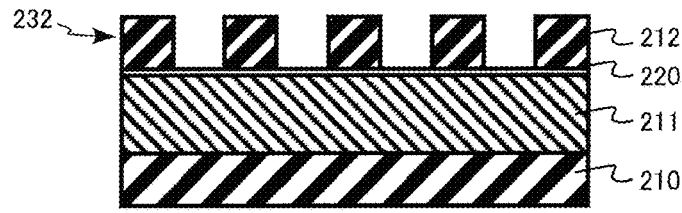
Figure 7C:
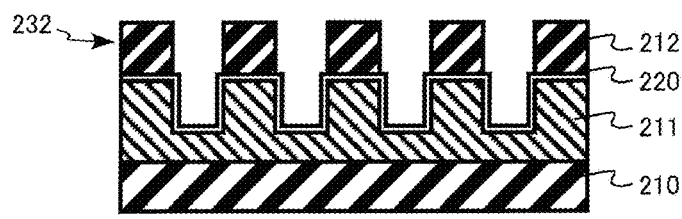

Next, the fourth insulating layer 212 is patterned to form a second mask pattern 232 (FIG. 7B). Next, using the second mask pattern 232 as a mask, the third insulating layer 211 is etched (FIG. 7C).

Figure 7D:
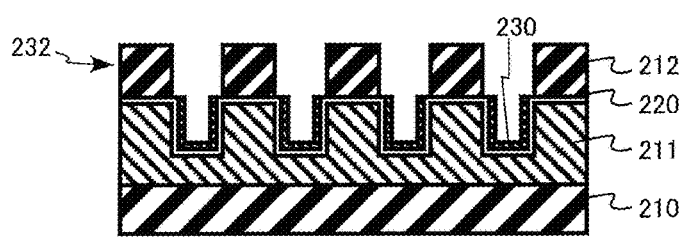
Figure 7E:
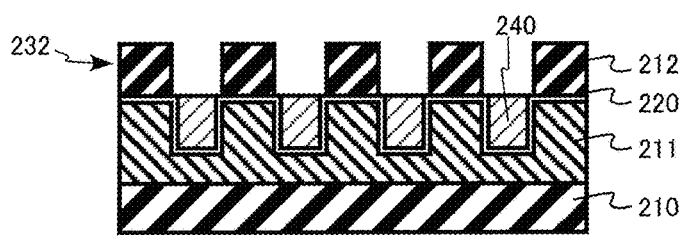
Figure 7F:
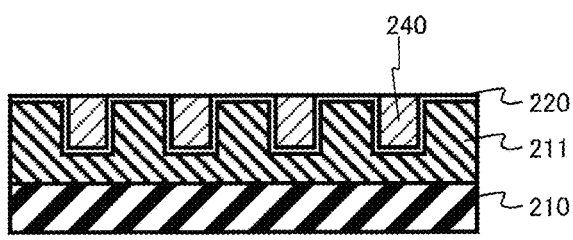

Next, a second catalyst layer 230 is selectively formed in a region where the third insulating layer 211 is etched (FIG. 7D). Next, a second metal layer 240 is formed on the second catalyst layer 230 by an electroless plating method (FIG. 7E). According to the above-described manufacturing method, the second metal layer 240 to be a second metal wiring is formed on the second substrate 210.

FIGS. 8A, 8B, and 8C are explanatory views of a method for bonding a substrate of a metal wiring according to the third embodiment. FIGS. 8A, 8B, and 8C are cross-sectional views of a process of bonding two substrates together.

First, the first substrate 110 and the second substrate 210 on which metal wirings are separately formed are prepared (FIG. 8A).

On the first substrate 110, the first metal layer 140 is formed using the same method as the method for forming the metal wiring of the first embodiment. On the first substrate 110, the first insulating layer 111, the first catalyst adsorption layer 120 and the first metal layer 140 are formed. The first substrate 110, the first insulating layer 111, the first catalyst adsorption layer 120, and the first metal layer 140 have the same configuration as those of the substrate 10, the first insulating layer 11, the catalyst adsorption layer 20, and the metal layer 40 of the first embodiment.

On the second substrate 210, the second metal layer 240 is formed by using the same method as the method for forming a metal wiring according to the first embodiment. On the second substrate 210, the third insulating layer 211, the second catalyst adsorption layer 220 and the second metal layer 240 are formed. The second substrate 210, the third insulating layer 211, the second catalyst adsorption layer 220, and the second metal layer 240 have the same configuration as those of the substrate 10, the first insulating layer 11, the catalyst adsorption layer 20, and the metal layer 40 according to the first embodiment.

Next, the second substrate 210 is turned upside down (FIG. 8B).

Next, the first substrate 110 and the second substrate 210 are bonded (FIG. 8C). The first substrate 110 and the second substrate 210 are bonded such that the first metal layer 140 and the second metal layer 240 are in contact with each other.

In the third embodiment, the first catalyst adsorption layer 120 is formed on the first insulating layer 111 on the surface of the first substrate 110. Furthermore, the second catalyst adsorption layer 220 is also formed on the third insulating layer 211 on the surface of the second substrate 210.

Therefore, the bonding strength between the first substrate 110 and the second substrate 210 is improved. Consequently, the bonding strength between the first substrate 110 and the second substrate 210 is improved.

As described above, according to the method for forming a metal wiring of the third embodiment, a metal wiring can be formed at low cost, as in the first embodiment. Furthermore, similarly to the second embodiment, substrate bonding can be realized at low cost. Furthermore, the bonding strength between the first substrate 110 and the second substrate 210 is improved.

The substrate bonding method described in the second embodiment or the third embodiment can be applied to, for example, the bonding of a substrate on which a semiconductor memory is formed and a substrate on which a logic IC is formed. The method can also be applied to the bonding of substrates on which semiconductor memories are formed. Further, the method can be applied to the bonding of substrates on which logic ICs are formed. The method can be applied to bonding between substrates on which the same type or different types of semiconductor devices are formed.

While certain embodiments have been described, these embodiments have been presented by way of example only, and are not intended to limit the scope of the inventions. Indeed, a method for forming a metal wiring described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for forming a metal wiring, comprising:
forming a first insulating layer on a substrate;
forming a catalyst adsorption layer by bringing a surface of the first insulating layer into contact with a solution containing a compound having a triazine skeleton, a first functional group of one of a silanol group and an alkoxysilyl group, and a second functional group of at least one selected from the group consisting of an amino group, a thiol group, a carboxyl group, and an azide group;
forming a second insulating layer different from the first insulating layer on the catalyst adsorption layer;
patterning the second insulating layer to form a mask pattern;
etching the first insulating layer by a wet etching method using the mask pattern as a mask;
forming selectively a catalyst layer in a region where the first insulating layer is etched; and
forming a metal layer on the catalyst layer by an electroless plating method.

2. The method for forming a metal wiring according to claim 1, further comprising: removing the mask pattern after the forming the metal layer.

3. The method for forming a metal wiring according to claim 1, wherein the compound is a compound represented by the following formula (1), at least one of A, B, and C in the formula (1) is the first functional group, at least one of the A, B, and C is the second functional group, and $R^1$, $R^2$, and $R^3$ are optionally present linking groups

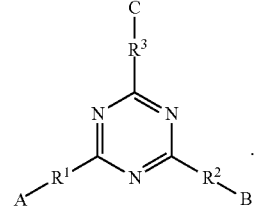

(1)

4. The method for forming a metal wiring according to claim 1, wherein the second insulating layer is a resin.

5. The method for forming a metal wiring according to claim 1, wherein the second insulating layer is a photoresist.

6. The method for forming a metal wiring according to claim 1, wherein the first insulating layer is an oxide, a nitride, or an oxynitride.

7. The method for forming a metal wiring according to claim 1, wherein a thickness of the catalyst adsorption layer is 2 nm or less.

8. The method for forming a metal wiring according to claim 1, wherein a chemical solution used in the wet etching method contains hydrogen fluoride, ammonium fluoride, or phosphoric acid.

9. A method for forming a metal wiring, comprising:
forming a first insulating layer on a first substrate;
forming a catalyst adsorption layer by bringing a surface of the first insulating layer into contact with a solution containing a compound having a triazine skeleton, a first functional group of one of a silanol group and an alkoxysilyl group, and a second functional group of at least one selected from the group consisting of an amino group, a thiol group, a carboxyl group, and an azide group;
forming a second insulating layer different from the first insulating layer on the catalyst adsorption layer;
patterning the second insulating layer to form a mask pattern;
etching the first insulating layer by a wet etching method using the mask pattern as a mask;
forming selectively a catalyst layer in a region where the first insulating layer is etched;
forming a first metal layer on the catalyst layer by an electroless plating method;
removing the mask pattern after the forming the first metal layer; and
bonding the first substrate and a second substrate to bring the first metal layer and a second metal layer into contact with each other, the second metal layer being formed on the second substrate.

10. The method for forming a metal wiring according to claim 9, wherein the compound is a compound represented by the following formula (1), at least one of A, B, and C in the formula (1) is the first functional group, at least one of the A, B, and C is the second functional group, and $R^1$, $R^2$, and $R^3$ are optionally present linking groups

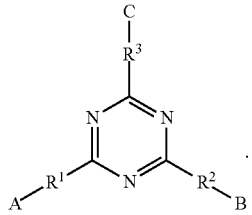

(1)

11. The method for forming a metal wiring according to claim 9, wherein the second insulating layer is a resin.

12. A method for forming a metal wiring, comprising:
forming a first insulating layer on a first substrate;
forming a first catalyst adsorption layer by bringing a surface of the first insulating layer into contact with a solution containing a first compound having a triazine skeleton, a first functional group of one of a silanol group and an alkoxysilyl group, and a second functional group of at least one selected from the group consisting of an amino group, a thiol group, a carboxyl group, and an azide group;
forming a second insulating layer different from the first insulating layer on the first catalyst adsorption layer;
patterning the second insulating layer to form a first mask pattern;
etching the first insulating layer by a wet etching method using the first mask pattern as a mask;
forming selectively a first catalyst layer in a region where the first insulating layer is etched;
forming a first metal layer on the first catalyst layer by an electroless plating method;
removing the first mask pattern after the forming the first metal layer;
forming a third insulating layer on a second substrate;
forming a second catalyst adsorption layer by bringing a surface of the third insulating layer into contact with a solution containing a second compound having a triazine skeleton, a first functional group of one of a silanol group and an alkoxysilyl group, and a second functional group of at least one selected from the group consisting of an amino group, a thiol group, a carboxyl group, and an azide group;
forming a fourth insulating layer different from the third insulating layer on the second catalyst adsorption layer;
patterning the fourth insulating layer to form a second mask pattern;
etching the fourth insulating layer by a wet etching method using the second mask pattern as a mask;
forming selectively a second catalyst layer in a region where the fourth insulating layer is etched;
forming a second metal layer on the second catalyst layer by an electroless plating method;
removing the second mask pattern after the forming the second metal layer; and
bonding the first substrate and the second substrate to bring the first metal layer and the second metal layer into contact with each other.

13. The method for forming a metal wiring according to claim 12, wherein the first compound and the second compound are compounds represented by the following formula (1), at least one of A, B, and C in the formula (1) is the first functional group, at least one of the A, B, and C is the second functional group, and $R^1$, $R^2$, and $R^3$ are optionally present linking groups

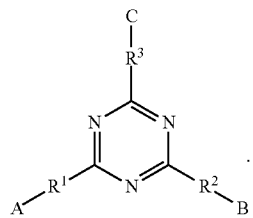

(1)

14. The method for forming a metal wiring according to claim 12, wherein the second insulating layer and the fourth insulating layer are resins.

* * * * *